(12) United States Patent
Ueno

(10) Patent No.: US 7,754,527 B2
(45) Date of Patent: Jul. 13, 2010

(54) LED AND METHOD OF MANUFACTURING THE SAME

(75) Inventor: Kazuhiko Ueno, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 724 days.

(21) Appl. No.: 11/199,168

(22) Filed: Aug. 9, 2005

(65) Prior Publication Data

US 2006/0038187 A1    Feb. 23, 2006

(30) Foreign Application Priority Data

Aug. 9, 2004    (JP) .............................. 2004-231828

(51) Int. Cl.
    *H01L 21/44*    (2006.01)
(52) U.S. Cl. .................. 438/106; 438/111; 438/112; 438/123; 438/124
(58) Field of Classification Search ............... 257/106, 257/111, 112, 123, 124
    See application file for complete search history.

(56) References Cited

U.S. PATENT DOCUMENTS

| | | | |
|---|---|---|---|
| 6,066,861 A | 5/2000 | Hohn et al. | 257/99 |
| 6,245,259 B1 | 6/2001 | Hohn et al. | 252/301.36 |
| 6,277,301 B1 | 8/2001 | Hohn et al. | 252/301.36 |
| 6,576,930 B2 | 6/2003 | Reeh et al. | 257/98 |
| 6,592,780 B2 | 7/2003 | Hohn et al. | 252/301.36 |
| 6,613,247 B1 | 9/2003 | Hohn et al. | 252/301.36 |
| 6,669,866 B1 | 12/2003 | Kummer et al. | 252/301.4 R |
| 6,774,401 B2 | 8/2004 | Nakada et al. | 257/82 |
| 6,809,342 B2 | 10/2004 | Harada | 257/79 |
| 6,812,500 B2 | 11/2004 | Reeh et al. | 257/98 |

FOREIGN PATENT DOCUMENTS

| | | |
|---|---|---|
| JP | 10-190065 | 12/1996 |
| JP | 2001-127346 | 10/1999 |
| JP | 2001-196639 | 1/2000 |
| JP | 2001-210872 | 1/2000 |
| JP | 2001-345483 | 5/2000 |
| JP | 2004-056075 | 12/2002 |

*Primary Examiner*—Long Pham
(74) *Attorney, Agent, or Firm*—Kenealy Vaidya LLP

(57) ABSTRACT

An LED can include a pair of electrode members, and an LED chip joined to a chip mount portion disposed at the extremity of one of the pair of electrode members. The LED chip can be electrically connected to the pair of electrode members. A transparent resin portion can include a wavelength conversion material mixed therein, the transparent resin portion formed in such a manner as to surround the LED chip, wherein the LED chip is positioned offset toward one side in the transparent resin portion, and wherein the wavelength conversion material mixed in the transparent resin portion has a higher density around the LED chip within the transparent resin portion.

10 Claims, 7 Drawing Sheets

LED AND METHOD OF MANUFACTURING THE SAME

This application claims the priority benefit under 35 U.S.C. §119 of Japanese Patent Application No. 2004-231828 filed on Aug. 9, 2004, which is hereby incorporated in its entirety by reference.

BACKGROUND OF THE INVENTION

1. Field of the Invention

The present invention relates to an LED adapted to allow light from an LED chip and excitation light from a fluorescent material to be emitted as color mixture light.

2. Description of the Related Art

A white LED is hitherto known that converts, through its transparent resin portion, blue light emitted from a blue LED chip into yellow light for mixture with the blue light to externally emit a resultant white light.

Such a white LED is configured as shown in FIG. 3, for example. Referring to FIG. 3, the white LED 1 includes a chip substrate 2, a blue LED chip 3 mounted on the chip substrate 2, and a transparent resin portion 4 having a fluorescent material 4a mixed therein. The transparent resin portion 4 is formed on top of the chip substrate 2 in such a manner as to surround the blue LED chip 3.

The chip substrate 2 is formed from a heat-resistant resin, such as a flat copper-clad wiring board for example, and includes on its surfaces a chip mount land 2a, a connection land 2b, and surface mounting terminals 2c and 2d extending therefrom via opposite end edges to its undersurfaces. The blue LED chip 3 is joined via e.g., die bonding, onto the chip mount land 2a of the chip substrate 2. An electrode on top of the blue LED chip 3 is electrically connected via wire bonding to the adjoining connection land 2b. The blue LED chip 3 is formed as a GaN chip, for example, such that it emits light having a peak wavelength at 450 to 470 nm, for example, when a drive voltage is applied.

The transparent resin portion 4 is formed from, e.g., transparent epoxy resin with the fluorescent material 4a in the form of fine particles mixed therein, and is molded onto the chip substrate 2 before hardening. During operation, blue light from the blue LED chip 3 impinges on the transparent resin portion 4 so that the fluorescent material 4a is excited to generate yellow light as excitation light from the fluorescent material 4a, thus emitting white light as a result of mixture of the different colors of light.

The fluorescent material 4a is, for example, a fluorescent material issuing a wide range of colored lights around true yellow. The fluorescent material is a material such as cerium-doped YAG fluorescent material, cerium-doped TAG fluorescent material, or orthosilicate fluorescent material (BaSrCa)SiO4. The fluorescent material 4a being arranged to issue a fluorescent light having its peak wavelength at 530 to 590 nm, for example.

According to the thus configured white LED 1, application of the drive voltage to the blue LED chip 3 via the surface mounting terminals 2c and 2d allows emission of light from the blue LED chip 3. The resultant blue light impinges on the fluorescent material 4a mixed in the transparent resin portion 4 to thereby excite the fluorescent material 4a to generate yellow light. This yellow light mixes with the blue light from the blue LED chip 3, resulting in white light issued to the exterior.

However, as size-reduction requirements progress in the thus configured white LED 1, there arises a need to secure the space for a bonding wire from the blue LED chip 3 to the connection land 2b, making it difficult to position the blue LED chip 3 at or near the center of the chip substrate 2 or near the center of the transparent resin.

As shown in FIG. 3, this leads to a comparatively elongated distance by which the blue light L1 issued from the blue LED chip 3 toward the connection land 2b travels through the interior of the transparent resin portion 4. Consequently, more fluorescent material 4a is excited by the blue light L1 from the blue LED chip 3, allowing the light externally emitted from the transparent resin portion 4 in the direction of the blue light L1 to contain more yellow light which can result in a yellowish white light.

Furthermore, since the transparent resin portion 4 is made, for example, by molding and then hardening epoxy resin with the fluorescent material 4a mixed therein, the fluorescent material 4a tends to settle onto the underlying chip substrate 2 before the hardening, as shown in FIG. 4. This characteristic is due to gravity, and based on the difference in the specific gravity between the fluorescent material 4a and the epoxy resin.

For this reason, light L2 outgoing laterally from the sidewalls of the blue LED chip 3 travels through part of the transparent resin portion 4 containing less fluorescent material 4a. This results in less fluorescent material 4a being excited by the blue light L2 from the blue LED chip 3, whereupon the outgoing light from the transparent resin portion 4 to the exterior in the direction of the blue light L2 contains less yellow light which can result in white light that is short of yellow tint (having a blue tint).

This means that different colors of light appear depending on the viewing direction in such a type of LED.

SUMMARY OF THE INVENTION

The present invention was conceived in view of the above and other problems and deficiencies. An aspect of the present invention is to provide an LED with a simple configuration, adapted to emit light of a uniform color in its entirety even if the LED chip is not positioned at or near the center of the chip substrate.

According to another aspect of the invention there is provided an LED that can include a pair of electrode members, an LED chip joined to a chip mount portion disposed at the extremity of one of the pair of electrode members, the LED chip electrically connected to the pair of electrode members, and a transparent resin portion with wavelength conversion material mixed therein. The transparent resin portion can be formed in such a manner as to surround the LED chip, wherein the LED chip is positioned offset toward one side in the transparent resin portion, and wherein the wavelength conversion material mixed in the transparent resin portion has a higher density around the LED chip within the transparent resin portion.

An LED made in accordance with the principles of the invention can include a lens portion made of a transparent resin surrounding the LED chip and the transparent resin portion, wherein the pair of electrode members are two lead frames extending in parallel with each other. The pair of electrode members can be formed on a chip substrate and can be in the form of electrically conductive patterns extending to the underside of the chip substrate to define surface mounting terminals. The transparent resin portion can be filled within a recessed portion that is upwardly flared so as to allow exposure of the chip mount portion in the form of a frame-shaped member formed on the chip substrate. When formed, the transparent resin portion can be hardened keeping the transparent resin portion such that the side thereof closer to the LED chip orients downward.

According to another aspect of the invention there is provided a method of manufacturing an LED that can include joining an LED chip onto a chip mount portion disposed at the extremity of one of a pair of electrode members and electrically connecting the LED chip to the pair of electrode members. The method can also include forming a transparent resin portion with wavelength conversion material mixed therein in such a manner as to surround the LED chip, wherein the LED chip is positioned offset toward one side in the transparent resin portion, and when the transparent resin portion is hardened, keeping the transparent resin portion such that the side thereof closer to the LED chip orients downward.

The LED chip can emit light when a drive voltage is applied to the LED chip via the pair of electrode members. Light emitted from the LED chip then issues to the exterior through the transparent resin portion. At that time, the light emitted from the LED chip impinges on the wavelength conversion material within the transparent resin portion to excite the wavelength conversion material to issue excitation light. Color mixture light thus issues forth toward the exterior as a result of a mixture of colors of the light from the LED chip and the excitation light from the wavelength conversion material.

At that time, the LED chip may be offset toward one side within the transparent resin portion, and hence light emitted from the LED chip toward the other sides travel through longer distances within the transparent resin portion. However, in the regions outside the surrounding regions of the LED chip within the transparent resin portion, the density of the wavelength conversion material may be low such that there is not much difference between the number of wavelength conversion particles struck by light emitted from the LED chip toward one side and the number of wavelength conversion particles struck by light emitted toward other sides.

Accordingly, light emitted from the entire transparent resin portion of the LED to the exterior is prevented from causing unevenness in color depending on direction, ensuring emission of light of generally uniform color. In this case, by merely controlling the distribution of density of the wavelength conversion material mixed in the transparent resin portion, the present LED can be fabricated at low cost without using additional or unnecessary members, etc., and without the need to increase the number of production steps.

A cannonball-type LED may be configured in a case where the pair of electrode members are two lead frames extending in parallel with each other and where the LED is provided with a lens portion made of transparent resin surrounding the LED chip and the transparent resin portion.

A surface-mount-type LED may be configured in a case where the pair of electrode members are formed on the chip substrate and are made of electrically conductive patterns extending to the underside of the chip substrate to define the surface mounting terminals.

A surface-mount-type LED provided with a so-called lamphouse can be adapted to reduce the outgoing light upward in a case where the transparent resin portion is filled within the recessed portion that is upwardly flared so as to allow exposure of the chip mount portion in the form of a frame-shaped member formed on the chip substrate.

In a case where the transparent resin portion, when formed, is hardened in such a manner that the side closer to the LED chip of the transparent resin portion is oriented downward, the wavelength conversion material mixed in the pre-hardening transparent resin portion can settle down due to gravity based on the difference in the specific gravity between the wavelength conversion material and the transparent resin. Thus, the wavelength conversion material can gather toward the LED chip near the lower end of the transparent resin portion. As a result, when the transparent resin portion is hardened, the wavelength conversion material gathers around the LED chip within the transparent resin portion to present a higher density. Thus, the present LED can easily be fabricated at low cost without the need for additional members and/or additional process steps, by orienting the side of the transparent resin portion that is closer to the LED chip downward when the transparent resin portion is hardened.

The transparent resin portion, when hardened, can be kept such that the side closer to the LED chip of the transparent resin portion orients downward, whereby the wavelength conversion material mixed in the pre-hardening transparent resin portion settles downward due to gravity and based on the difference in the specific gravity between the wavelength conversion material and the transparent resin. Thus, the wavelength conversion material can gather toward the side closer to the LED chip of the transparent resin portion. As a result, when the transparent resin portion hardens, the wavelength conversion material gathers around the LED chip within the transparent resin portion to present a high density.

In consequence, light emitted from the LED chip toward the other sides travels through longer distances within the transparent resin portion. However, since the density of the wavelength conversion material within the transparent resin portion is low in the regions outside the surrounding regions of the LED chip within the transparent resin portion, there is not much difference between the number of wavelength conversion particles struck within the transparent resin portion by the light issuing from the LED chip toward one side and the number of wavelength conversion particles stuck by the light issuing toward the other sides.

Accordingly, light emitted from the entire LED transparent resin portion to the exterior does not exhibit unevenness in color depending on direction, ensuring emission of light of generally uniform color.

In this case, the present LED can be fabricated at low cost without using any specific members, etc., and without increasing the number of production steps, by controlling the distribution of density of the wavelength conversion material mixed in the transparent resin portion. This can be accomplished by keeping the transparent resin portion such that the side thereof closer to the LED chip orients downward during production.

In this manner, an LED can be provided that is adapted to issue light of generally uniform color through a simple configuration even when the LED chip is not located at or near the center of the chip substrate.

BRIEF DESCRIPTION OF THE DRAWINGS

The above and other objects, aspects, features and advantages of the invention will become more apparent from the following detailed description when taken in conjunction with the accompanying drawings, in which.

DESCRIPTION OF PREFERRED EMBODIMENTS

Preferred embodiments of the invention will now be described with reference to FIGS. 1, 2 and 5-7 of the accompanying drawings. Although a variety of technical features are imparted to the following embodiments, which are merely specific examples of the present invention, the scope of the invention is not to be construed as being limited thereto.

Figure 1:
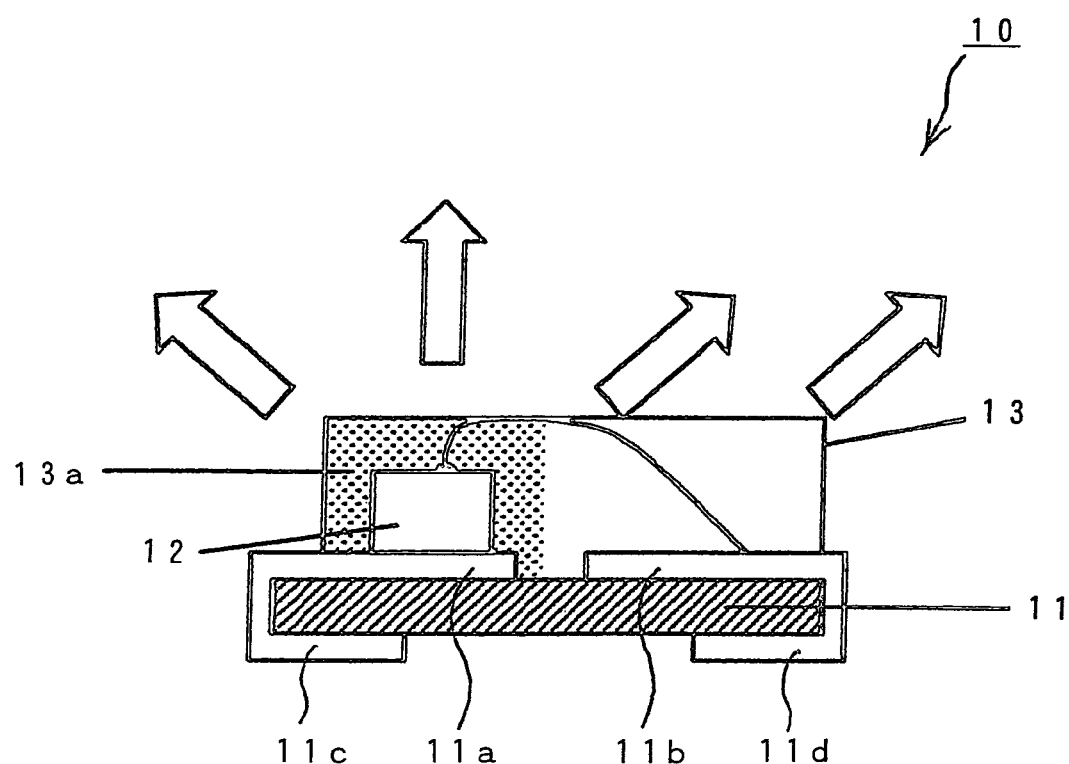
FIG. 1 is a schematic sectional view showing the configuration of an embodiment of an LED made in accordance with the principles to the invention.

FIG. 1 shows a configuration of an embodiment of a white LED made in accordance with the principles of the invention. In FIG. 1, the white LED generally designated at 10 can be configured as a so-called surface-mount-type LED and can include a chip substrate 11, a blue LED chip 12 mounted on the chip substrate 11, and a transparent resin portion 13 having a wavelength conversion material, such as a fluorescent material 13a, mixed therein. The transparent resin portion 13 can be formed on top of the chip substrate 11 in such a manner as to substantially surround the blue LED chip 12.

The chip substrate 11 can be formed from a heat-resistant resin such as a flat copper-clad wiring board, for example, and can include on its surfaces a chip mount land 11a, a connection land 11b, and surface mounting terminals 11c and 11d extending therefrom via opposite end edges to its undersurfaces. In this case, since the chip substrate 11 has a reduced surface area due to the downsizing of the entire LED, the chip mount land 11a is positioned such that it is offset toward one side (leftward in the diagram), not at the center of the top surface of the chip substrate 11.

The blue LED chip 12 is of a known configuration and can be joined via die bonding or other attachment method/structure, onto the chip mount land 11a of the chip substrate 11. An electrode can extend from the top of the blue LED chip 12 and be electrically connected via wire bonding etc. to the adjoining connection land 11b.

The blue LED chip 12 can be formed as a GaN chip, for example, such that it emits light having a peak wavelength at 450 to 470 nm when a drive voltage is applied.

The transparent resin portion 13 can be formed from a transparent material, e.g., transparent epoxy resin, with fluorescent material 13a in the form of fine particles mixed therein, and can be molded onto the chip substrate 11 before hardening. Blue light from the blue LED chip 12 impinges on the transparent resin portion 13 so that the fluorescent material 13a is excited to generate yellow light known as excitation light from the fluorescent material 13a, thus emitting white light as a result of the mixture of those colors of light.

The wavelength conversion material can be a fluorescent material 13a that is capable of issuing a wide color range of light around true yellow. The material can be a cerium-doped YAG fluorescent material, cerium-doped TAG fluorescent material, orthosilicate fluorescent material (BaSrCa)SiO4, or other similar material. The fluorescent material 4a can be arranged to issue a fluorescent light having its peak wavelength at 530 to 590 nm, for example.

Figure 3:
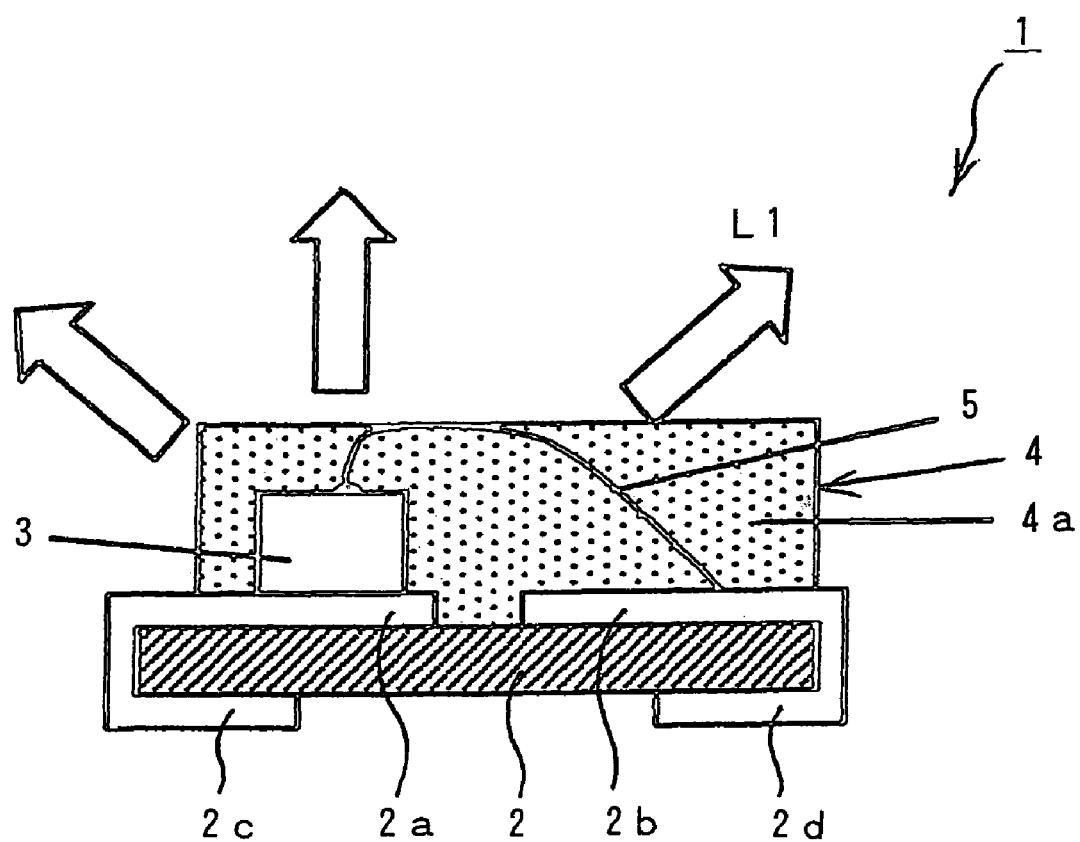
FIG. 3 is a schematic sectional view showing the configuration of an example of a conventional surface-mount-type white LED.
Figure 4:
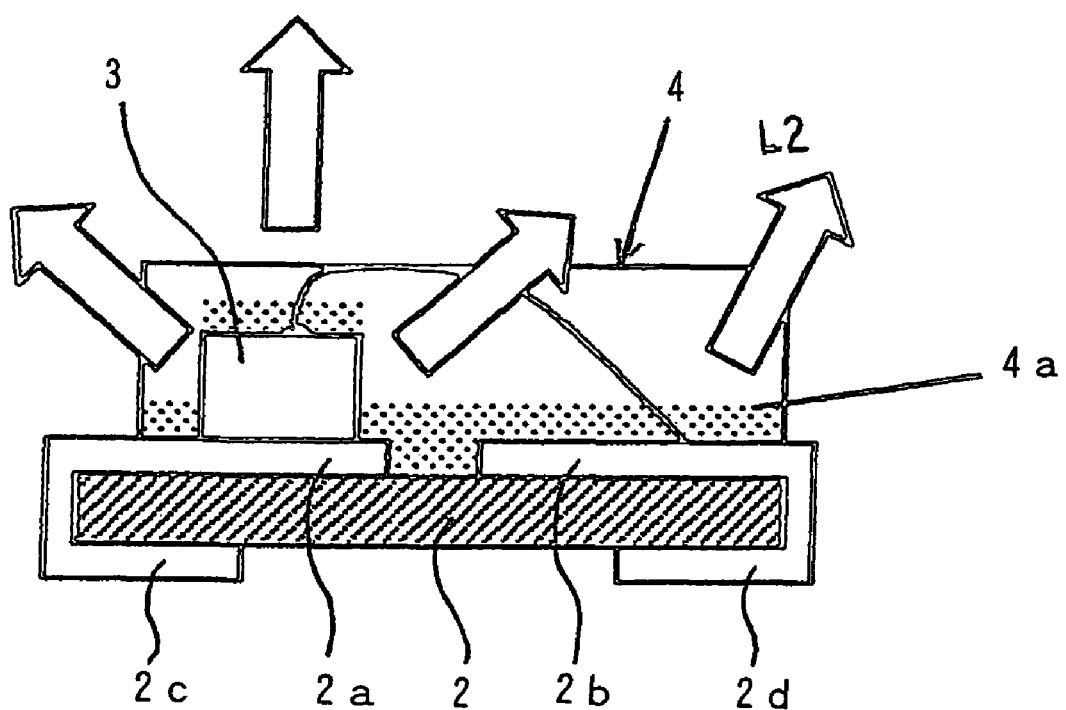
FIG. 4 is a schematic sectional view showing the state of settlement of fluorescent particles in the transparent resin portion of the surface-mount-type white LED of FIG. 3.

Although some of the characteristics and features of the above configurations are similar to that of the conventional surface-mount-type white LED 1 shown in FIG. 3, the white LED 10 of FIG. 1 allows the fluorescent material 13a to be offset toward the LED chip 12 within the transparent resin portion 13. In other words, the fluorescent material 13a can be mixed at a higher density within the transparent resin portion 13 at a location close to the LED chip 12 as compared to a location away from the LED chip 12.

Figure 2:
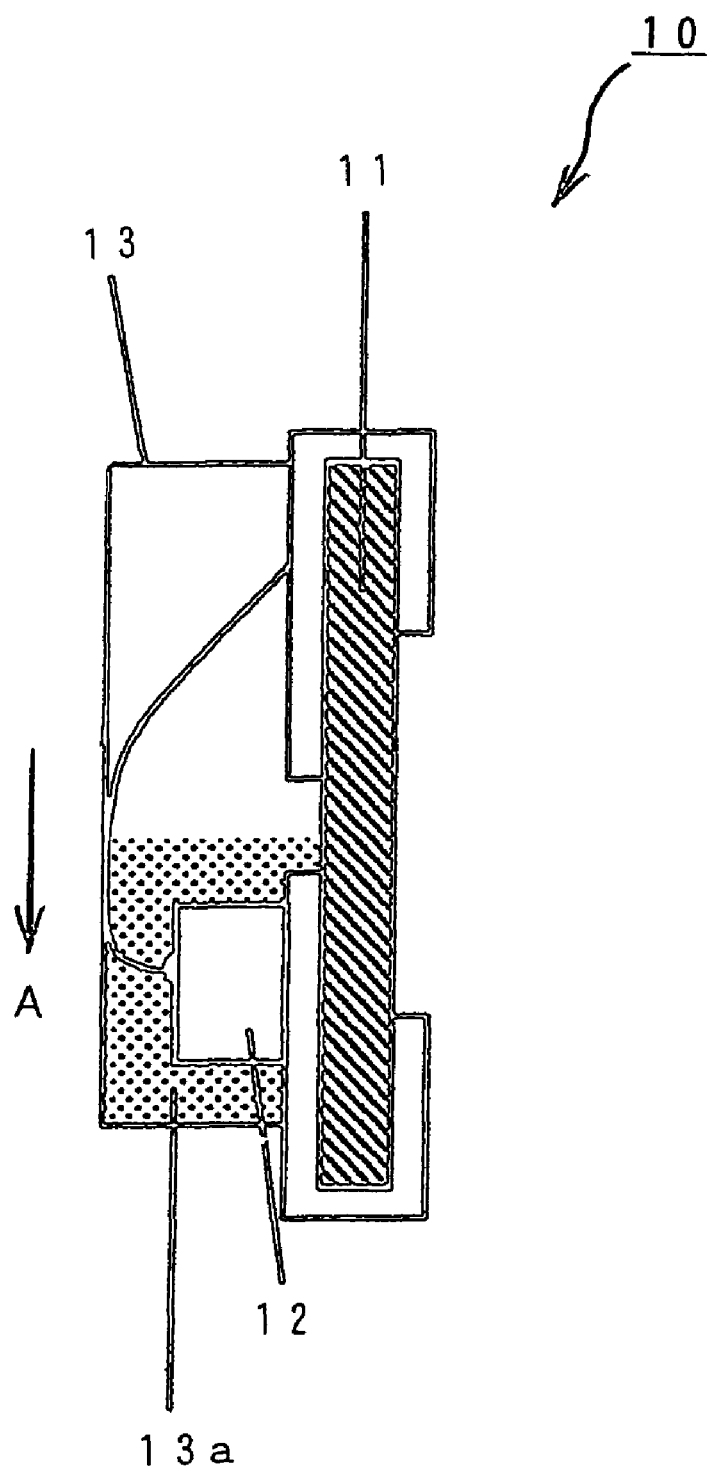
FIG. 2 is a schematic sectional view showing hardening of a transparent resin portion in accordance with a manufacturing process for the LED of FIG. 1.

Such a distribution of density can be obtained by disposing the transparent resin portion 13 and the chip substrate 11 such that the end of the transparent resin portion 13 closer to the LED chip 12 orients downward as shown in FIG. 2 when the transparent resin portion 13 is hardened.

As a result, the fluorescent material 13a mixed in the transparent resin making up the pre-hardening transparent resin portion 13 descends due to gravity as indicated by arrow A in FIG. 2, based on the difference in the specific gravity between the fluorescent material and the transparent resin. The fluorescent material 13a (or other wavelength converting material), then settles down toward the LED chip 12 within the transparent resin portion 13.

Accordingly, by making use of certain features of the conventional manufacturing process for a white LED 1, a desired distribution of density of the fluorescent material 13a can be obtained through a simple operation of altering the direction of the transparent resin portion 13 and the chip substrate 11, as shown in FIG. 2, when the transparent resin portion 13 is being hardened. This process may not require additional members/structures and/or unnecessary process steps.

Figure 5:
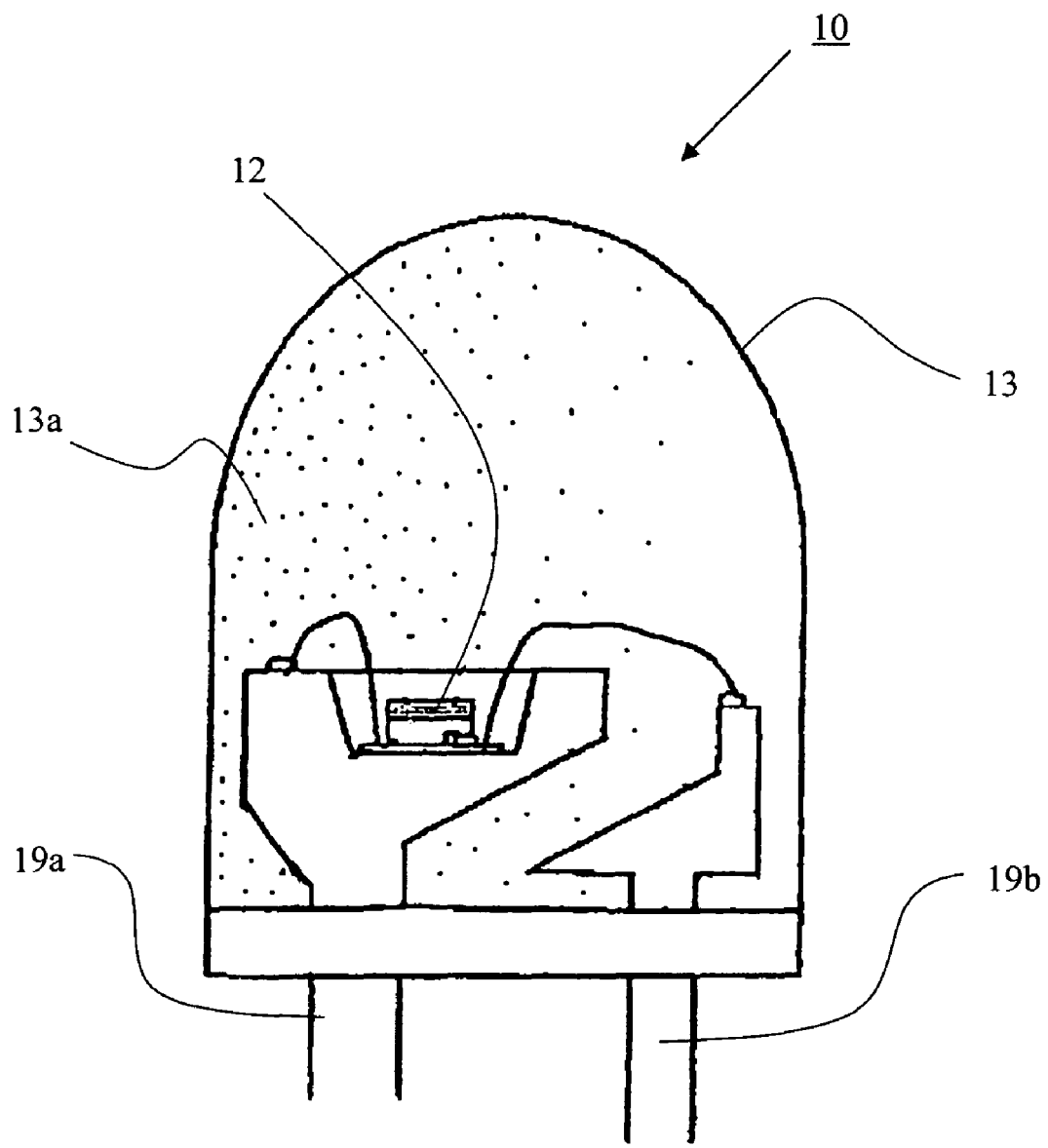
FIG. 5 is a schematic sectional view showing another embodiment of an LED made in accordance with the principles of the invention.

FIG. 5 shows another embodiment of an LED made in accordance with the principles of the present invention. In particular, FIG. 5 shows the LED formed as a cannonball type LED in which the blue LED chip 12 can be located within a lens shaped resin material portion 13. Wavelength conversion material 13a can be dispersed within the resin portion such that the density of wavelength conversion material 13a is higher adjacent the LED chip and less dense further from the LED chip 12. The electrodes for the LED can be formed as two parallel extending lead frames 19a and 19b.

Figure 6:
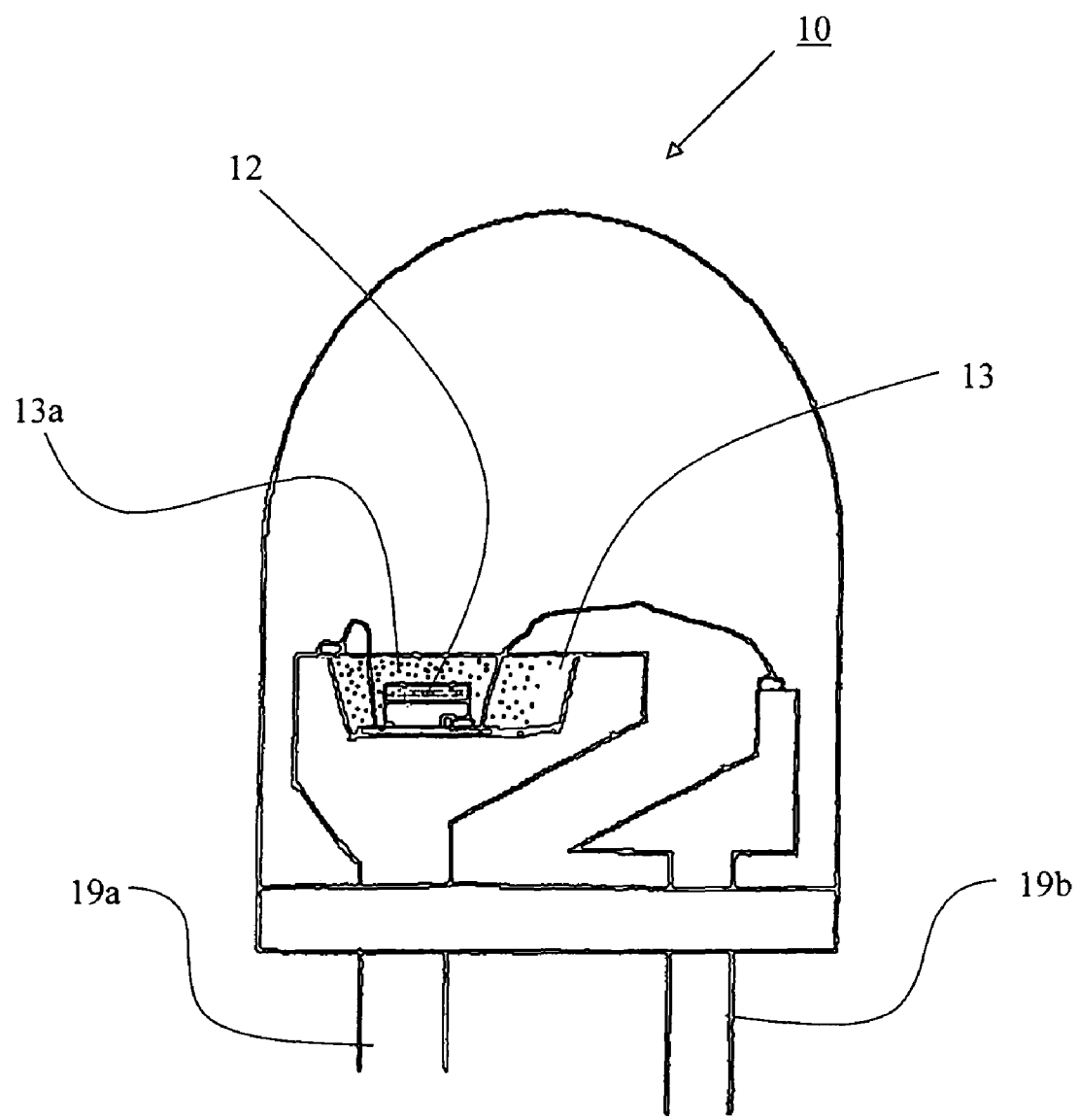
FIG. 6 is a schematic sectional view showing another embodiment of an LED made in accordance with the principles of the invention.

FIG. 6 shows yet another embodiment of an LED made in accordance with the principles of the present invention. In FIG. 6 the LED is also formed as a cannonball type LED in which the blue LED chip 12 can be located within a resin material portion 13. A transparent lens shaped resin portion can be formed over the LED chip 12 and resin material portion 13. Wavelength conversion material 13a can be dispersed within the resin portion 13 such that the density of the wavelength conversion material 13a is higher adjacent the LED chip and less dense further from the LED chip 12. The electrodes for the LED can be formed as two parallel extending lead frames 19a and 19b.

Figure 7:
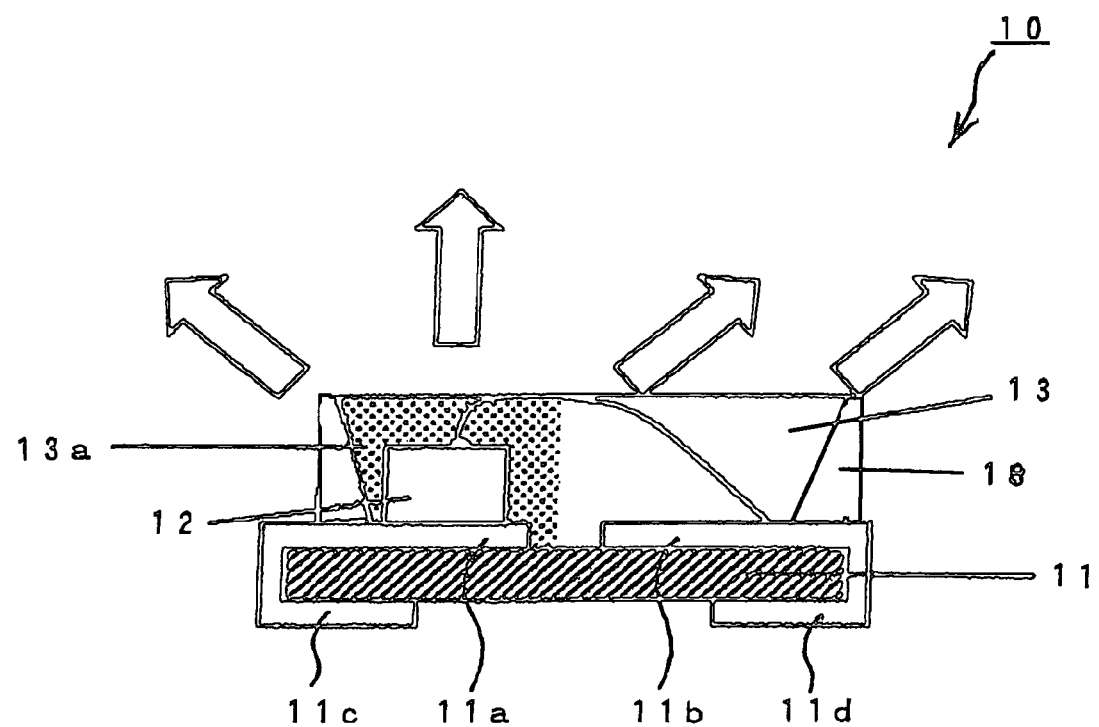
FIG. 7 is a schematic sectional view showing another embodiment of an LED made in accordance with the principles of the invention.

FIG. 7 shows another embodiment of an LED made in accordance with the principles of the present invention. In FIG. 7 the LED includes an LED chip 12 located within a resin portion 13. A frame member 18 can be mounted to the chip substrate and can include a recessed portion that is upwardly flared. The LED chip 12 and transparent resin portion 13 can be located within the recessed portion of the frame member 18 such that light emitted by the LED chip 12 is reflected in a particular direction by the walls of the recessed portion.

The LED 10 can be thus configured, and application of a drive voltage to the blue LED chip 12 via the surface mounting terminals 11c and 11d (or lead frames 19a and 19b) causes emission of light of the blue LED chip 12. Part of the blue light issuing from the blue LED chip 12 impinges on the fluorescent material 13a mixed in the transparent resin portion 13 such that the fluorescent material 13a is excited to generate yellow light. This yellow light mixes with the blue light from the blue LED chip 12, resulting in white light which in turn travels through the interior of the transparent resin portion 13 and is emitted to the exterior of the device.

In the above examples, the fluorescent material 13a exists at higher density around the LED chip 12 within the transparent resin portion 13, whereas the density of the fluorescent material 13a becomes lower in the region outside the surroundings of the LED chip 12.

Hence, while in FIG. 1, light L outgoing from the LED chip 12 toward the other sides travels through a longer distance within the transparent resin portion 13, there is not much difference between the number of fluorescent particles 13a struck by the light L and the number of fluorescent particles 13a struck by light L' outgoing from the LED chip 12 toward one side within the transparent resin portion 13 due to the lower density of the fluorescent material 13a in the regions far from the LED chip 12. This means that light from the LED chip 12 excites substantially the same number of fluorescent particles 13a in all directions, thus generating substantially the same yellow light by excitation in all directions. Thus, light that is emitted from the entire transparent resin portion 13 of the LED 10 to the exterior in different directions experiences little or no unevenness in color depending on direction, and can present a generally uniform white light.

In this manner, according to the surface-mount-type white LED 10, even though blue light emitted from the LED chip 12 in certain other directions travels through a longer distance within the transparent resin portion 13, they can impinge on substantially the same number of fluorescent particles 13a as light in other directions. This is due to the lower density of the fluorescent material 13a in particular areas of the resin portion 13. Therefore, light emitted from the LED chip 12 in different directions mixes with yellow light presented by the fluorescent particles 13a so that generally uniform white light can be issued without causing substantial unevenness in color with respect to various directions.

At that time, making use of certain features of the conventional white LED manufacturing process without need for additional members/structures for implementation or unnecessary process steps, the present LED can easily be manufactured at low cost without additional facility costs by keeping the transparent resin portion 13 and the chip substrate 11 in a predetermined direction during the time that the transparent resin portion 13 is hardened.

Although a so-called lamphouse is not disposed around the blue LED chip 12 in the above described embodiments, use of an LED provided with a lamphouse is contemplated in conjunction with the present invention. Although the blue LED chip 12 is mounted on the chip mount substrate by way of example in the above surface mount embodiment, a so-called cannonball-type LED mounted at one extremity of two lead frames, along with other LED structures, for example, are contemplated for use with the principles of the present invention.

Although, in the above described embodiments, blue light from the blue LED chip 12 is converted via fluorescent material 13a into yellow light to obtain white light as a result of mixture of the blue light with the yellow light, mixture or emission of other colors is also contemplated by the present invention. For example, an LED configured in accordance with the principles of the invention could convert light from the LED chip into light of other color by the fluorescent material so that color mixture of the light from the LED chip and the excitation light from the fluorescent material is issued to the exterior.

Furthermore, although the above described embodiments use fluorescent material for the purpose of converting the wavelength of light from the LED chip, the present invention is not intended to be limited thereto. Use of other wavelength conversion material is also contemplated by the present invention.

Thus, an extremely excellent LED that emits light of generally uniform color, even in the case where the LED chip is not positioned at or near the center of the chip substrate, can be obtained.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A method of manufacturing an LED, comprising:
providing an LED chip and a pair of electrodes having a chip mount portion;
locating the LED chip adjacent the chip mount portion disposed on one of the pair of electrodes;
electrically connecting the LED chip to the pair of electrodes;
forming a transparent resin portion with a wavelength conversion material mixed therein in a manner such that the transparent resin portion substantially surrounds the LED chip, the transparent resin portion including a top surface being located above an upper surface of the LED chip, a bottom surface, and at least one side surface;
positioning the LED chip in the transparent resin portion such that the LED chip is offset toward one side surface of the transparent resin portion;
rotating the transparent resin portion such that the side surface of the transparent resin which the LED chip is offset toward is located in a downside direction and an opposed side surface of the transparent resin portion which is opposite to the side surface is located in an upside direction; and
hardening the transparent resin portion, after rotating the resin portion, while the side surface of the transparent resin portion that is closer to the LED chip is located in the downside direction and the opposed side surface of the transparent resin portion which is opposite to the side surface is located in the upside direction.

2. The method of manufacturing an LED of claim 1, further comprising:
allowing a force to orient the wavelength conversion material such that a density of the wavelength conversion material in the transparent resin portion is greater at a location near the LED chip and lesser at a location further from the LED chip.

3. The method of manufacturing an LED of claim 1, wherein positioning includes orienting the transparent resin portion in the downside direction such that the downside direction faces towards a gravitational field and the opposed side surface is located further from the gravitational field than the side surface.

4. The method of manufacturing an LED of claim 1, further comprising:
dispersing the wavelength conversion material within the transparent resin portion such that light emitted from the LED chip undergoes a substantially equal amount of wavelength conversion regardless of direction of light emission for the LED.

5. The method of manufacturing an LED of claim 1, wherein the LED chip emits light along a central optical axis of the LED chip when an electrical current is passed between the electrodes, and the central optical axis of the LED chip is substantially perpendicular to a direction of gravitational force when positioning the transparent resin portion such that the side surface thereof closer to the LED chip is oriented in the downside direction.

6. The method of manufacturing an LED of claim 1, wherein the LED chip emits light along a central optical axis of the LED chip when an electrical current is passed between the electrodes, and the central optical axis of the LED chip intersects the top surface of the transparent resin portion at a substantially right angle and also intersects the bottom surface of the transparent resin, and the side surface is located at an outermost peripheral surface of the transparent resin portion when viewed along the central optical axis.

7. The method of manufacturing an LED of claim 6, wherein the side surface is oriented in the downside direction such that the side surface is located closer to a ground surface than all other surfaces of the LED.

8. The method of manufacturing an LED of claim 1, wherein positioning the transparent resin portion such that the side surface thereof closer to the LED chip is oriented in the downside direction includes positioning the transparent resin portion such that the top surface of the transparent resin portion is substantially parallel with a direction of gravitational force.

9. The method of manufacturing an LED of claim 1, wherein the top surface of the transparent resin portion and the bottom surface of the transparent resin portion are directly opposed to each other and substantially parallel with respect to each other, the bottom surface of the transparent resin being in contact with the LED chip, and the side surface of the transparent resin portion is located at an outermost peripheral surface of the transparent resin portion when viewed from an axis normal to the top surface of the transparent resin portion.

10. The method of manufacturing an LED of claim 1, wherein the LED chip is connected to the chip mount portion at an attachment location and the bottom surface is located closer to the attachment location than a distance at which the side surface is located from the attachment location, the side surface being an outermost peripheral surface of the transparent resin portion when viewed from along a central optical axis of the LED chip.

\* \* \* \* \*